(12) United States Patent
Schmitz

(10) Patent No.: US 11,791,909 B2
(45) Date of Patent: Oct. 17, 2023

(54) METHOD AND TEST SYSTEM FOR MEASURING A TOTALLY RADIATED POWER

(71) Applicant: Rohde & Schwarz GmbH & Co. KG, Munich (DE)

(72) Inventor: Sebastian Schmitz, Munich (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 345 days.

(21) Appl. No.: 17/179,755

(22) Filed: Feb. 19, 2021

(65) Prior Publication Data

US 2021/0266078 A1 Aug. 26, 2021

(30) Foreign Application Priority Data

Feb. 20, 2020 (EP) .................................... 20158455

(51) Int. Cl.
*H04B 17/10* (2015.01)

(52) U.S. Cl.
CPC .................................. *H04B 17/102* (2015.01)

(58) Field of Classification Search
CPC .................................................... H04B 17/102
See application file for complete search history.

(56) References Cited

U.S. PATENT DOCUMENTS

| | | | |
|---|---|---|---|
| 2008/0129615 A1 | 6/2008 | Breit et al. | |
| 2019/0187199 A1 | 6/2019 | Mellein | |
| 2019/0229817 A1* | 7/2019 | Axmon | H04B 7/0691 |

FOREIGN PATENT DOCUMENTS

| | | | | |
|---|---|---|---|---|
| EP | 3837562 A1 | * | 6/2021 | ......... G01R 29/0871 |
| EP | 3857241 B1 | * | 9/2022 | ......... G01R 1/07307 |
| WO | WO-2006047677 A1 | * | 5/2006 | ............. G01R 29/10 |

OTHER PUBLICATIONS

Friden, J., et al., "Angular sampling, Test Signal, and Near Field Aspects for Over-th-Air Total Radiated Power Assessment in Anechoic Chambers," Ericsson Research, Ericsson AB, arXiv:1803.10993v2 [eess.SP], Apr. 3, 2018, 14 pages.

R&S® TS8991 OTA Performance Text System "Single-source turnkey solutions for cellular and non-cellular wireless testing," Rohde & Schwarz, Oct. 31, 2016, 24 pages.

"Universal Mobile Telecommunications System (UMTS); Measurements of radio performances for UMTS terminals in speech mode," Technical Report ETSI TR 125 914, Version 10.0.0, Release 10, 3rd Generation Partnership Project (3GPP™), May 2011, 69 pages.

* cited by examiner

*Primary Examiner* — Samina F Choudhry
(74) *Attorney, Agent, or Firm* — CHRISTENSEN O'CONNOR JOHNSON KINDNESS PLLC

(57) ABSTRACT

A method of measuring a total radiated power of a device under test by a test system is described. The test system has a measurement antenna, a positioning system and a control and/or measurement equipment, wherein the device under test is positioned on the positioning system. The method includes: moving the device under test with respect to an azimuth axis and an elevation axis by the positioning system; transmitting a time dependent signal by the device under test; and recording a correlation between the control and/or measurement equipment and a respective spherical position of the positioning system. Furthermore, a test system for measuring a total radiated power of a device under test is described.

20 Claims, 1 Drawing Sheet

METHOD AND TEST SYSTEM FOR MEASURING A TOTALLY RADIATED POWER

FIELD OF THE DISCLOSURE

Embodiments of the present disclosure generally relate to a method of measuring a totally radiated power of a device under test by a test system. Further, embodiments of the present disclosure relate to a test system for measuring a totally radiated power of a device under test.

BACKGROUND

Modern communication devices are tested with regard to their totally radiated power by a test system that is configured to position the device under test at different measurement points that relate to spherical positions. Thus, the device under test is moved to the respective measurement points, wherein a certain measurement is performed at the respective measurement point. Afterwards, the device under test is moved to another measurement point, namely another spherical position, wherein another measurement is performed. Thus, several angular positions, namely several spherical positions, of the device under test are directly measured. In addition, a software is used to interpolate the respective measurement points in order to gather the totally radiated power.

However, the approaches known in the state of the art result in less accurate as well as less repeatable measurements, which is undesired.

Accordingly, there is a need for a method and a test system ensuring accurate and repeatable measurements of the device under test.

SUMMARY

The present disclosure provides examples of a method of measuring a totally radiated power of a device under test by a test system. The test system has a measurement antenna, a positioning system and a control and/or measurement equipment. The device under test is positioned on the positioning system. In an embodiment, the method comprises the steps of:

moving the device under test with respect to an azimuth axis and an elevation axis by the positioning system;

transmitting time-dependent signals by the device under test; and recording a correlation between the control and/or measurement equipment and a respective spherical position of the positioning system.

Further, the present disclosure provides examples of a test system for measuring a totally radiated power of a device under test. In an embodiment, the test system comprises a control and/or measurement equipment, a measurement antenna and a positioning system for supporting a device under test. The positioning system is configured to move the device under test with respect to an azimuth axis and an elevation axis. The device under test is configured to transmit time-dependent signals. The test system is configured to record a correlation between the control and/or measurement equipment and a respective spherical position of the positioning system.

Accordingly, the respective angular positions, namely the spherical positions, can be reached in a highly accurate manner. Further, it is ensured that the respective spherical positions are reached in a repeatable manner due to the correlation between the respective positions taken and the control and/or measurement equipment, namely the measurement data obtained. Thus, it is possible to perform totally radiated power measurements of the device under test in an extremely fast manner for various applications. Furthermore, an angular error is very low, as no software control is required such as an interpolation between different measurement points effectively reached.

In general, the methods as well as the test systems ensure that a positioning error between the actual position of the device under test and the measurement data is reduced.

The respective device under test may relate to a user equipment, for instance a mobile phone, or a base station or any other wireless communication device to be tested by the test system.

For instance, a link antenna may be provided that is used for testing a mobile phone with regard to its totally radiated power. Thus, a respective signaling link is established between the device under test and the optional link antenna in order to maintain a respective signaling link.

An aspect provides that the correlation is obtained by signals exchanged. The positioning system as well as the control and/or measurement equipment may communicate with each other in order to ensure the correlation. Thus, the respective correlation is not achieved by a post-processing that correlates data logged afterwards. The exchange of signals between the control and/or measurement equipment and the positioning system ensures a correlation in real time, thereby enabling high speed measurements and correlated measurement results instantaneously. In other words, an active communication between the control and/or measurement equipment and the positioning system takes place, which ensures the real time synchronization.

Another aspect provides that the correlation is recorded in real time. This ensures to move the positioning system and, thus, the device under test located thereon at a high speed, for example the maximum speed possible. Therefore, the entire measurement time required can be reduced appropriately, as it is not necessary that the positioning system stops or slows down when reaching a respective spherical position.

According to an embodiment, the control and/or measurement equipment transmits a request signal to the positioning system to the positioning system to return its exact spherical position. Hence, the control and/or measurement equipment demands from the positioning system to identify its respective exact spherical position. In other words, the positioning system is asked by the control and/or measurement equipment to provide its exact spherical position. The request signal may be sent in real time.

Further, the request signal may be sent whenever a respective time-dependent signal is transmitted by the device under test. Accordingly, the control and/or measurement equipment communicates simultaneously with the device under test as well as the positioning system. In some embodiments, the device under test transmits the time-dependent signal to the control and/or measurement equipment via the measurement antenna, whereas the control and/or measurement equipment transmits the request signal to the positioning system.

The control and/or measurement equipment may know when the time dependent signal will be transmitted by the device under test. Therefore, the control and/or measurement equipment sends the request signal in due time, namely when the time dependent signal is outputted by the device under test. In other words, a synchronized communication may be provided, as the control and/or measurement equipment requests the exact spherical position of the positioning system when the device under test sends the time dependent signal, namely at the respective measurement position. Thus, a high resolution can be achieved.

Another aspect provides that the positioning system receives and processes the request signal. The positioning system may have an internal processing unit composed of one or more circuits that is able to process the request signal receives.

The positioning system may await the request signal and saves information of its exact spherical position. The positioning system may have an internal buffer or storage medium for storing the exact spherical position. Accordingly, the positioning system is configured to directly send the information concerning the exact spherical position.

The positioning system may send a return signal to the control and/or measurement equipment, indicating its exact spherical position. Therefore, the positioning system is configured to transmit signals to the control and/or measurement equipment in order to establish a bidirectional communication link with the control and/or measurement equipment. Accordingly, the respective information as well as the control signals can be exchanged between the control and/or measurement equipment and the positioning system that moves the device under test along a sphere. As mentioned above, the positioning system is configured to process signals received from the control and/or measurement equipment in order to forward its exact spherical position to the control and/or measurement equipment.

In other words, the positioning system returns its current exact position in real time. The control and/or measurement equipment receives the respective return signal from the positioning system, wherein the respective information received, namely the exact spherical position of the positioning system, is processed in order to correlate the control and/or measurement equipment, namely the measurement data, with the exact spherical position of the positioning system.

According to an embodiment, the positioning system sends a trigger signal to the control and/or measurement equipment. The trigger signal is processed internally by the control and/or measurement equipment appropriately.

In some embodiments, the trigger signal indicates that a certain spherical position will be reached by the positioning system. Therefore, the control and/or measurement equipment gets aware of an upcoming measurement position in time.

In some embodiments, the control and/or measurement equipment receives and processes the trigger signal in order to prepare itself for an upcoming measurement. The measurement corresponds to the reception of the time dependent signal from the device under test. In other words, the control and/or measurement equipment gets armed for the respective measurement.

The control and/or measurement equipment may transmit the request signal in response to the trigger signal received from the positioning system. Therefore, the trigger signal triggers the control and/or measurement equipment to prepare itself for an upcoming measurement while triggering the control and/or measurement equipment simultaneously to issue the request signal in order to get the exact spherical position of the positioning system.

Another aspect provides that the positioning system is moving continuously during the measurement of the totally radiated power of the device under test. The measurement time needed can be reduced, as the positioning system moves the device under test continuously.

In some embodiments, the positioning system is moving without stopping at respective measurement points, for example without slowing down at the respective measurement points. Hence, the measurement time can be optimized.

For instance, the device under test is moved along the azimuth axis continuously. Additionally or alternatively, the device under test is moved along the elevation axis continuously or in a stepped manner. The device under test is moved at least along one of the axes in a continuous manner such that the device under test is moved continuously during the measurement of the totally radiated power.

According to another aspect, the device under test is assigned to certain time frames during which the device under test is permitted to send, resulting in the time-dependent signals. The respective time frame is not used entirely by the device under test when transmitting its respective signals. For instance, the time-dependent signals may relate to pulsed continuous wave signals, 5G signals, for example 5G-NR-FR2 signals, 4G-LTE signals, for instance 4G-LTE time division duplex (TDD) signals. The portion of the time frame used for sending the respective signal may vary.

Furthermore, a spherical position of the device under test may be derived from the spherical position of the positioning system. In some embodiments, the positioning system has a certain location at which the device under test is to be mounted for testing purposes. Thus, the respective spherical position of the device under test can be determined from the exact spherical position of the positioning system that is transmitted.

In general, the test system is configured to perform a method of measuring a totally radiated power of a device under test as discussed above.

Generally, the features mentioned above also applies to the test system in a similar manner.

Accordingly, an extremely fast spherical data acquisition is ensured.

The control and/or measurement equipment may have freely configurable and/or signal depend request triggers (request signals). These request signals may be fed to a processing unit inside the positioning system that buffers (temporally stores) the true position of the positioning system, namely the exact spherical position. The duration of the request signals, namely the request triggers, is less than 2 µs which is more than sufficient for every kind of time dependent signal.

In some embodiments, the maximum speed of the positioning system may be 72 deg/s, resulting in 5 seconds for one phi rotation. Assuming a signal repeatability of 10 ms (5G-NR) this would result is roughly 500 measurements, i.e. an angular resolution of 0.72°. This is ideal for a device under test with a highly directivity antenna, for instance a mobile phone.

When measuring both polarizations simultaneously, the total measurement time can be reduced to 13 Minutes in a stepped-continuous approach. The maximum expected angular error may be 0.00072°.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

In some embodiments described herein, the term "module" refers to a combination of hardware (e.g. a processor such as an integrated circuit or other circuitry) and software (e.g. machine- or processor-executable instructions, commands, or code such as firmware, programming, or object code). Furthermore, a combination of hardware and software may include hardware only (i.e. a hardware element with no software elements), software hosted at hardware (e.g. software that is stored at a memory and executed or interpreted at a processor), or hardware with the software hosted thereon. In some embodiments, the hardware may, inter alia, comprise a CPU, a GPU, an FPGA, an ASIC, or other types of electronic circuitry.

Figure 1:
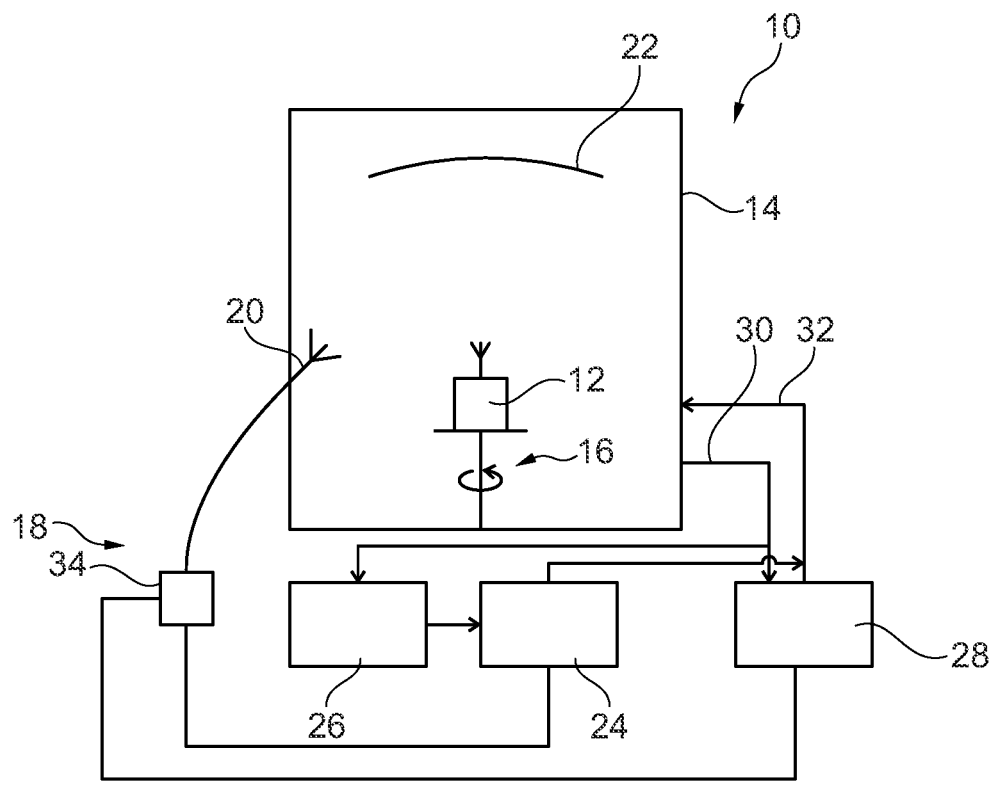
FIG. 1 schematically shows a schematic overview of a test system according to an embodiment of the present disclosure.

FIG. 1 shows a test system 10 for measuring a totally radiated power of a device under test 12. The test system 10 comprises an anechoic chamber 14 in which the device under test 12 is placed. In some embodiments, the device under test 12 is mounted on a positioning system 16 that is also located within the anechoic chamber 14. The positioning system 16 is a 3-dimensional positioning system such that the device under test 12 can be moved along a sphere for performing different measurements. In some embodiments, the 3-dimensional positioning system includes a plurality of motorized stages (e.g., linear or angular stages) that are controllable via receipt of suitable control signals.

In general, the positioning system 16 is configured to move the device under test 12 along an azimuth axis as well as along an elevation axis in a continuous manner. However, the positioning system 16 in some embodiments may also move the device under test 12 along the azimuth axis in a continuous manner, but along the elevation axis in a stepped manner.

The test system 10 also comprises a control and/or measurement equipment 18 that is connected with a measurement antenna 20 that is assigned to the anechoic chamber 14 as well, namely its interior.

In the shown embodiment, the test system 10 further comprises a reflector 22 which is located in the anechoic chamber 14. The reflector 22 is assigned to the measurement antenna 20 as well as the device under test 12 such that far-field conditions can be achieved within the anechoic chamber 14.

In the shown embodiment of FIG. 1, the control and/or measurement equipment 18 comprises a signal generator 24, an analyzer 26 composed of one or more circuits, and a trigger engine 28 that is used to communicate with the positioning system 16. As shown in FIG. 1, the trigger engine 28 has an input line 30 and an output line 32 that are assigned to the anechoic chamber 14. Accordingly, the trigger engine 28 may issue a trigger via the output line 32 or receive a trigger via the input line 30.

The trigger engine 28 is also connected with the analyzer 26, for instance a spectrum analyzer, via its input line 30. Thus, the trigger received via the input line 30 is also forwarded to the analyzer 26. In addition, the trigger engine 28 is connected with the signal generator 24 via its output line 32.

The signal generator 24 as well as the analyzer 26 may be connected with the measurement antenna 20 such that radio frequency signals can be transmitted or received via the measurement antenna 20. Furthermore, a connection between a radio frequency signal processing unit 34 and the trigger engine 28 is established. In an embodiment, the radio frequency signal processing unit 34 is composed of one or more circuits.

Figure 2:
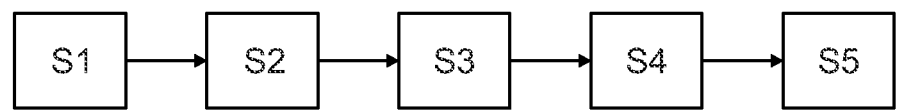
FIG. 2 shows a flow-chart illustrating a method of measuring a totally radiated power of the device under test according to an embodiment of the present disclosure.

In any case, the control and/or measurement equipment 18 may know when the device under test 12 transmits a time-dependent signal, as this is processed by the respective components discussed above such that the respective information is forwarded to the trigger engine 28 if necessary, as will be discussed hereinafter with reference to FIG. 2.

In a first step S1, the device under test 12 is moved along the azimuth axis and the elevation axis by the positioning system 16 in order to reach another measurement position at which the device under test 12 outputs the time dependent signal to be received by the measurement antenna 20 in order to gather measurement data. In some embodiment, the measurement antenna 20 forwards the signal received to the control and/or measurement equipment 18 for further processing, for instance the analyzer 26.

In a second step S2, the device under test 12 outputs the time dependent signal at the respective measurement position, wherein the time dependent signal is received and processed by the control and/or measurement equipment 18 to gather the measurement data.

In a third step S3, the control and/or measurement equipment 18 transmits a request signal to the positioning system 16 to return its exact spherical position. The request signal may relate to a request trigger. In some embodiment, the request signal is sent by the trigger engine 28. In some embodiment, the request signal is sent whenever the respective time dependent signal is transmitted by the device under test 12. This information is known to the control and/or measurement equipment 18, for example due to the signal processing unit 34 that has a communication link to the trigger engine 28. The request signal is very short in time such that it can be sent during the transmission of the time dependent signal. Put differently, the request signal can be sent in real time.

In a fourth step S4, the positioning system 16 receives and processes the request signal. In some embodiment, the positioning system 16 awaits the request signal and saves information of its exact spherical position, for example buffers the information. Thus the positioning system 16 is configured to output the information concerning its exact spherical position immediately.

In a fifth step S5, the positioning system 16 sends a response signal to the control and/or measurement equipment 18, indicating its exact spherical position. The information is processed by the control and/or measurement equipment 18, for example the trigger engine 28, in order to record a correlation between the positioning system 16 and the control and/or measurement equipment 18. In some embodiments, the correlation between the exact spherical positions of the positioning system 16 and the measurement data is recorded. In some embodiments, the response signal may also be sent in real time.

Accordingly, the information concerning the exact spherical position of the positioning system 16 is gathered in real time.

Since the device under test 12 is located at a predefined position at the positioning system 16, the spherical position of the device under test 12 can be derived from the position of the positioning system 16 received.

In a certain embodiment, the positioning system 16 may initially send a trigger signal to the control and/or measurement equipment 18, for example the trigger engine 28. The trigger signal may indicate that a certain spherical position will be reached by the positioning system 16. Hence, the control and/or measurement equipment 18 receiving and processing the trigger signal can prepare itself for an upcoming measurement.

Then, the control and/or measurement equipment 18 transmits the request signal in response to the trigger signal received from the positioning system 16.

Alternatively, the control and/or measurement equipment 18 knows when the time dependent signal will be transmitted by the device under test 12.

Generally, the communication between the control and/or measurement equipment 18 and the positioning system 16 is done in real time. This ensures that the positioning system 16 is configured to move continuously during the measurement of the total radiated power of the device under test 12, namely without stopping at respective measurement points, for example without slowing down at the respective measurement points. Therefore, accurate and repeatable measurements of the device under test 12 can be performed.

Certain embodiments disclosed herein, for example the respective module(s), units, control and/or measurement equipment, analyzer, etc., utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about", "approximately", "near" etc., mean plus or minus 5% of the stated value.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A method of measuring a total radiated power of a device under test by a test system, wherein the test system has a measurement antenna, a positioning system and a control and/or measurement equipment, wherein the device under test is positioned on the positioning system, and wherein the method comprises:
    moving the device under test with respect to an azimuth axis and an elevation axis by the positioning system;
    transmitting a time dependent signal by the device under test, wherein the device under test is assigned to certain time frames during which the device under test is permitted to send, resulting in the time dependent signals; and
    recording a correlation between the control and/or measurement equipment and a respective spherical position of the positioning system,
    wherein the control and/or measurement equipment transmits a request signal to the positioning system to return its exact spherical position.

2. The method according to claim 1, wherein the correlation is obtained by signals exchanged.

3. The method according to claim 1, wherein the correlation is recorded in real time.

4. The method according to claim 1, wherein the request signal is sent whenever a respective time dependent signal is transmitted by the device under test.

5. The method according to claim 1, wherein the positioning system receives and processes the request signal.

6. The method according to claim 1, wherein the positioning system awaits the request signal and saves information of its exact spherical position.

7. The method according to claim 1, wherein the positioning system sends a response signal to the control and/or measurement equipment, indicating its exact spherical position.

8. The method according to claim 1, wherein the positioning system sends a trigger signal to the control and/or measurement equipment.

9. The method according to claim 8, wherein the trigger signal indicates that a certain spherical position will be reached by the positioning system.

10. The method according to claim 8, wherein the control and/or measurement equipment receives and processes the trigger signal in order to prepare itself for an upcoming measurement.

11. The method according to claim 8, wherein the control and/or measurement equipment transmits a request signal to the positioning system to return its exact spherical position, and wherein the control and/or measurement equipment transmits the request signal in response to the trigger signal received from the positioning system.

12. The method according to claim 1, wherein the positioning system is moving continuously during the measurement of the total radiated power of the device under test.

13. The method according to claim 1, wherein the positioning system is moving continuously during the measurement of the total radiated power of the device under test without stopping at respective measurement points.

14. The method according to claim 1, wherein the positioning system is moving continuously during the measurement of the total radiated power of the device under test without slowing down at the respective measurement points.

15. The method according to claim 1, wherein the device under test is moved along at least one of the azimuth axis continuously and the elevation axis continuously or in a stepped manner.

16. The method according to claim 1, wherein a spherical position of the device under test is derived from the spherical position of the positioning system.

17. A test system for measuring a total radiated power of a device under test, the test system comprising:
a control and/or measurement equipment, a measurement antenna and a positioning system for supporting a device under test, wherein the positioning system is configured to move the device under test with respect to an azimuth axis and an elevation axis, wherein the device under test is configured to transmit a time dependent signal, the device under test being assigned to certain time frames during which the device under test is permitted to send, resulting in the time dependent signals,
wherein the test system is configured to record a correlation between the control and/or measurement equipment and a respective spherical position of the positioning system,
wherein the control and/or measurement equipment is configured to transmit a request signal to the positioning system to return its exact spherical position, or
wherein the positioning system is configured to send a trigger signal to the control and/or measurement equipment, wherein the trigger signal indicates that a certain spherical position will be reached by the positioning system such that the control and/or measurement equipment becomes aware of an upcoming measurement position in time.

18. A method of measuring a total radiated power of a device under test by a test system, wherein the test system has a measurement antenna, a positioning system and a control and/or measurement equipment, wherein the device under test is positioned on the positioning system, and wherein the method comprises:
moving the device under test with respect to an azimuth axis and an elevation axis by the positioning system;
transmitting a time dependent signal by the device under test; and
recording a correlation between the control and/or measurement equipment and a respective spherical position of the positioning system,
wherein the device under test is assigned to certain time frames during which the device under test is permitted to send, resulting in the time dependent signals, and
wherein the positioning system sends a trigger signal to the control and/or measurement equipment, wherein the trigger signal indicates that a certain spherical position will be reached by the positioning system such that the control and/or measurement equipment becomes aware of an upcoming measurement position in time.

19. The method according to claim 1, wherein the positioning system receives and processes the request signal while directly sending the information concerning the exact spherical position.

20. The method according to claim 18, wherein the positioning system sends a trigger signal to the control and/or measurement equipment such that the control and/or measurement equipment becomes aware of an upcoming measurement position in time, wherein the control and/or measurement equipment receives and processes the trigger signal in order to prepare it for an upcoming measurement which corresponds to the reception of the time dependent signal from the device under test.

* * * * *